United States Patent
Manning et al.

[11] Patent Number: 5,946,259
[45] Date of Patent: Aug. 31, 1999

[54] VOLTAGE GENERATOR METHODS AND APPARATUS

[75] Inventors: Troy A. Manning; Manny K. F. Ma, both of Boise, Id.

[73] Assignee: Micron Technology, Inc., Boise, Id.

[21] Appl. No.: 09/144,736

[22] Filed: Sep. 1, 1998

Related U.S. Application Data

[62] Division of application No. 08/665,481, Jun. 18, 1996.

[51] Int. Cl.$^6$ .............................. G11C 7/00; G11C 16/04
[52] U.S. Cl. ..................... 365/226; 365/189.09; 365/149
[58] Field of Search .............................. 365/226, 189.11, 365/149, 189.09

[56] References Cited

U.S. PATENT DOCUMENTS

| | | | |
|---|---|---|---|
| 4,161,791 | 7/1979 | Leach | 365/149 |
| 4,249,194 | 2/1981 | Rogers | 357/51 |
| 4,467,450 | 8/1984 | Kuo | 365/149 |
| 4,667,312 | 5/1987 | Doung et al. | 365/185.27 |
| 5,266,821 | 11/1993 | Chern et al. | 257/312 |
| 5,665,995 | 9/1997 | Hsue et al. | 257/390 |

OTHER PUBLICATIONS

Streetman, B.G., "Solid State Electronic Devices", *3rd Edition, Prentice Hall Series in Solid State Physical Electronics*, Nick Holonyak, Jr., Series Editor, (1990).

*Primary Examiner*—Huan Hoang
*Attorney, Agent, or Firm*—Schwegman, Lundberg, Woessner & Kluth P.A.

[57] ABSTRACT

A reduced threshold voltage (Vt) magnitude or depletion mode metal-oxide-semiconductor (MOS) capacitor capable of use in a charge pump circuit such as a substrate bias voltage generator in a dynamic random access memory (DRAM) integrated circuit. The Vt magnitude of a p-channel MOS field-effect transistor (FET) used as a capacitor is reduced by using the same ion-implantation step used to increase the Vt magnitude of an n-channel MOS FET. The Vt magnitude of an n-channel MOS FET used as a capacitor is reduced by using the same ion-implantation step used to increase the Vt magnitude of a p-channel MOS FET. By sufficiently reducing Vt magnitude, a depletion mode MOS capacitor is formed. Reduced Vt magnitude and depletion mode MOS capacitors increase the useful voltage range of the capacitor, optimizing operation at low supply voltages.

15 Claims, 4 Drawing Sheets

VOLTAGE GENERATOR METHODS AND APPARATUS

This application is a division of U.S. patent application Ser. No. 08/665,481 filed Jun. 18, 1996, (the '481 Application). The '481 Application is incorporated herein by reference.

THE FIELD OF THE INVENTION

The present invention relates to semiconductor integrated circuits and, more particularly, to implementation of a metal-oxide-semiconductor (MOS) capacitor which is suitable for use in a charge pump circuit such as a substrate bias voltage generator used in dynamic random access memory (DRAM) integrated circuits.

BACKGROUND OF THE INVENTION

Integrated circuit designers use a variety of components to implement desired circuit functionality. These components may include bipolar and field-effect transistors, junction diodes, capacitors, and resistors.

Capacitors are used in a wide variety of applications which require charge storage elements. An integrated circuit capacitor and integrated circuit resistor form a characteristic time constant useful as a delay element or for signal frequency filtering applications. Capacitors are particularly useful for power supply decoupling of digital complementary metal-oxide-semiconductor (CMOS) circuits which draw large transient current spikes during switching. A large capacitance connected between the power supply and ground can supply much of the charge drawn during these transient switching events, thereby smoothing the power supply voltage. Charge pump circuits are another application in which capacitors may be used. In charge pump circuits, MOS switches or pn junction diodes are used to control conduction of charge; the capacitors may be switched to convert an input power supply voltage to an output power supply of different voltage or polarity.

Integrated circuit capacitors can be implemented in a variety of different ways. A parallel plate capacitor constructed from two conductive plates separated by a dielectric layer. The conductive plates may each be composed of a metal, one conductive plate could be conductively doped polysilicon and the other conductive plate could be metal, or both conductive plates may be composed of conductively doped polysilicon. Such parallel plate capacitors may require additional process steps in forming a thin dielectric between the conductive plates, or in forming the conductive plates. In a metal-oxide-semiconductor (MOS) process, a MOS field-effect transistor (FET) having drain, gate, source, and body regions may also be used as a capacitor (MOS capacitor). Use of a MOS capacitor is advantageous since no process complexity is added to implement the capacitor; only existing process steps are used.

In FIG. 1, a schematic cross-sectional view of one embodiment of an n-channel MOS (NMOS) FET is illustrated. The NMOS FET has a conductively doped polysilicon gate region 100 formed on a thin dielectric region 110 which is formed on a lightly p-type doped substrate 120. Source region 130 and drain region 140 comprise heavily n-type doped diffusion regions.

In FIG. 1, the NMOS FET device is capable of being used as a capacitor. Such an NMOS capacitor 145 has a top plate comprising the conductively doped polysilicon gate 100. The bottom plate comprises the lightly doped semiconductor substrate 120 (body region of the FET). The top plate and bottom plate of the NMOS capacitor 145 are separated by the thin dielectric region 110.

The NMOS capacitor 145 bottom plate comprises a lightly doped semiconductor substrate 120 which has distinct regions of operation: accumulation, depletion, and inversion. These regions of operation are defined by the voltage applied to the NMOS capacitor 145. The NMOS capacitor 145 has a capacitance value which depends on the applied voltage, as described in Ben G. Streetman, *Solid State Electronic Devices*, 3rd ed., Prentice-Hall (1990).

FIG. 2 illustrates the NMOS capacitance 150 as a function of a voltage 160 which is applied to the gate 100 of the NMOS capacitor 145 with the bottom plate, substrate 120, held at ground voltage potential at 0V. In particular, as a positive dc voltage is applied to gate 100, the NMOS capacitance between the gate 100 and the substrate 120 decreases until a characteristic threshold voltage (Vt) 170 is reached, beyond which capacitance increases. Because of its reduced capacitance for positive voltages less than Vt applied to the gate 100, the NMOS capacitor 145 is most useful for such voltages which exceed Vt. Thus, the Vt of the NMOS capacitor 145 limits its useful voltage range.

Similarly, FIG. 3 illustrates a schematic cross-sectional view of a p-channel MOS (PMOS) FET device. The PMOS FET has a conductively doped polysilicon gate region 180 formed on a thin dielectric region 190 which is formed on a lightly n-type doped substrate 200. Source region 210 and drain region 220 comprise heavily p-type doped diffusion regions. The PMOS FET device is capable of being used as a capacitor. The top and bottom plates of PMOS capacitor 225 are separated by the thin dielectric region 190.

FIG. 4 illustrates the PMOS capacitance 230 as a function of a voltage 240 which is applied to the gate 180 of the PMOS capacitor 225 with the bottom plate, substrate 200, held at ground voltage potential. In particular, as a negative dc voltage is applied to gate 180, the PMOS capacitance between the gate 180 and the substrate 200 decreases until a characteristic threshold voltage (Vt) 250 is reached, beyond which capacitance increases. Because of its reduced capacitance for voltages between Vt and 0V applied to the gate 180, the PMOS capacitor is most useful for voltages more negative than Vt. Thus, the magnitude of the threshold voltage Vt of the PMOS capacitor limits its useful voltage range.

As semiconductor technology progress and device dimensions are scaled downward, power supply voltages are typically reduced to keep electric fields within the FET devices within an acceptable value. Power supplies are also lowered to reduce power consumption of integrated circuit die used in portable electronic devices. As the power supply voltages are reduced, the effect of the magnitude of Vt on the useful voltage range of the MOS capacitor becomes increasingly important.

SUMMARY OF THE INVENTION

The present invention discloses a MOS capacitor with increased voltage range, a method for its fabrication, and a charge pump substrate voltage generator circuit for a dynamic random access memory (DRAM) in which it is used. The method for fabricating the MOS capacitor includes forming a capacitor gate region separated from an underlying substrate by a dielectric layer. At least one first source/drain diffusion region is formed in the substrate from dopants of a first dopant type. The first source/drain diffusion region is adjacent to a channel region in the substrate underlying the capacitor gate region. Dopants of the first dopant type are implanted in at least part of the channel region. In this same step, the dopants are also implanted into a substrate region at least partially underlying a FET gate region of a FET having a second source/drain diffusion formed by implanting into the substrate dopants of a type opposite to the first dopants type.

A reduced threshold voltage (Vt) magnitude or depletion mode MOS capacitor is formed, thereby increasing its useful voltage range. In one embodiment, the Vt magnitude is reduced such that it is less than 0.3V. Such a capacitor is capable of operating at reduced power supply voltages. In one embodiment, a reduced Vt magnitude MOS capacitor is used in a charge pump circuit for generating a substrate bias voltage for a DRAM integrated circuit. In this embodiment, the reduced Vt magnitude MOS capacitor's capabilities comprise use as a charge transfer capacitor and as a gate drive capacitor. This allows the charge pump circuit to operate more effectively at reduced power supply voltages.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention discloses a metal-oxide-semiconductor (MOS) capacitor having an increased voltage range, a method for its fabrication, and charge pump substrate voltage generator circuit for a dynamic random access memory (DRAM) integrated circuit in which it is used. The increased voltage range is implemented by decreasing the magnitude of a threshold voltage (Vt) of the MOS capacitor. In one embodiment, the Vt is reduced sufficiently to form a depletion mode device. It is desirable to reduce the magnitude of Vt without adding steps to an existing conventional complementary metal-oxide-semiconductor (CMOS) process flow. A portion of the fabrication sequence of a MOS field-effect transistor (FET) is described below.

Figure 5:
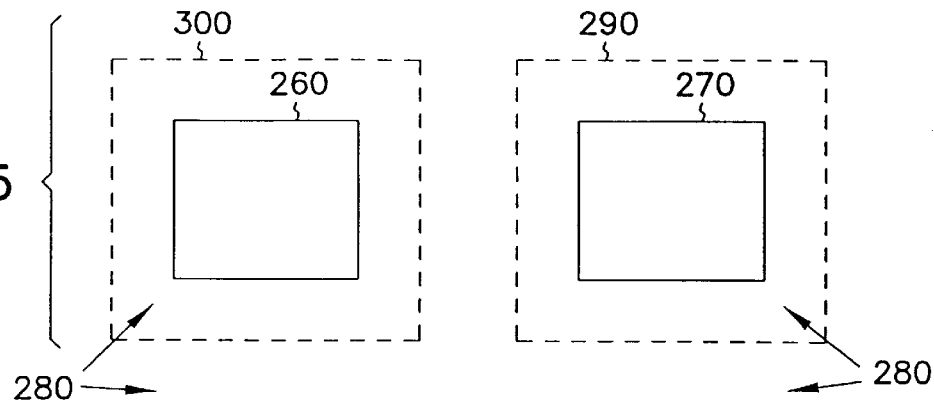
FIG. 5 is a schematic top view of a silicon wafer illustrating active area regions and masking regions.

FIG. 5 illustrates a top view of the silicon wafer on which active area regions 260, 270 are formed. It is understood that many other such active area regions are similarly formed on the silicon wafer, but are not illustrated in FIG. 5 for simplicity. A thick insulating field oxide is grown in a field oxide region 280 outside the active area regions 260 and 270. FETs are fabricated within the active area regions 260 and 270. These FETs are capable of being used as transistors or as MOS capacitors. The field oxide region 280 electrically isolates the FET transistors or capacitors in active area region 260 from other such devices in other active area regions such as active area region 270. Similarly, the field oxide region 280 electrically isolates the FET transistors or capacitors in active area region 270 from other such devices in other active area regions such as active area region 260.

In FIG. 5, the active area regions 260 and 270 are further divided into NMOS active area region 260, in which an NMOS FET is formed, and PMOS active area region 270, in which a PMOS FET is formed. As part of a typical CMOS process flow, dopants are implanted into the active areas to adjust the Vt of the FET to a desired value. For example, to adjust the Vt of the NMOS FET formed in NMOS active area region 260, the PMOS active area region 270 is first masked by a first masking layer 290. The first masking layer 290 is formed over the PMOS active area region 270 using conventional photoresist masking techniques. The first masking layer 290 prevents dopant implantation into the PMOS active area region 270 during the NMOS Vt adjustment implant step described below.

In FIG. 5, after formation of the first masking layer 290 over the PMOS active area region 270, an ion-implantation step is used to adjust the magnitude of Vt of an NMOS FET formed in the NMOS active area region 260. In a typical CMOS process flow, this Vt adjustment implant step comprises increasing the threshold voltage of an NMOS FET. By increasing the Vt of an NMOS FET, subthreshold leakage currents present in the FET are advantageously reduced.

After NMOS Vt adjustment, some CMOS process flows include an additional step for increasing the magnitude of the PMOS Vt. The first masking layer 290 over the PMOS active area region 270 is first removed using conventional photoresist cleaning techniques. A second masking layer 300 is formed over the NMOS active area region 260 using conventional photoresist masking techniques. The second masking layer 300 prevents dopant implantation into the NMOS active area region 260 during the optional PMOS Vt adjustment implant step described below.

In FIG. 5, after formation of the second masking layer 300 over the NMOS active area region 260, an ion-implantation step is used to increase the magnitude of Vt of a PMOS FET formed in the PMOS active area region. In a conventional CMOS process flow, increasing the magnitude of Vt of a PMOS FET has the advantage of reducing subthreshold leakage currents present in the FET.

Figure 6:
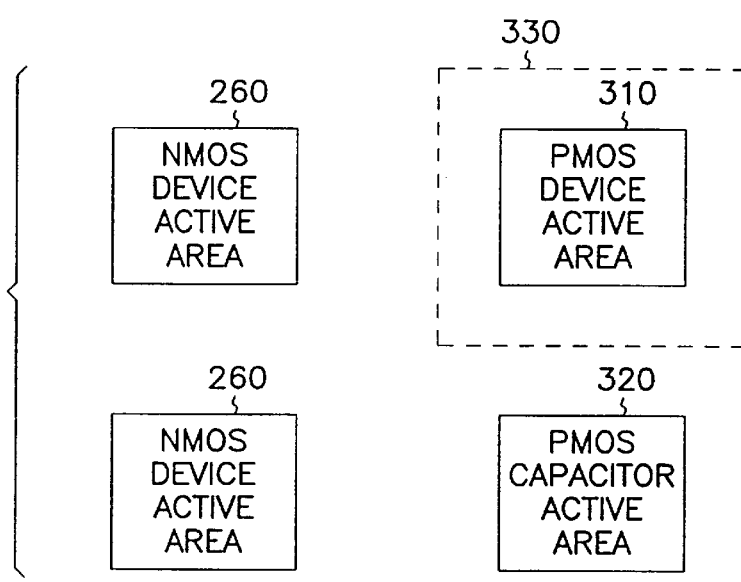
FIG. 6 is a schematic top view of a silicon wafer illustrating active area regions and masking regions including an active area region for forming a reduced magnitude threshold voltage (Vt) p-channel MOS FET used as a MOS capacitor.

The embodiment of FIG. 6 illustrates how a reduced magnitude Vt or depletion mode PMOS capacitor is formed. FIG. 6. illustrates multiple instances of NMOS active area regions 260 in which NMOS FETs used as transistor devices are formed. FIG. 6 also illustrates multiple PMOS active area regions, further differentiated as a PMOS device active area region 310 and a PMOS capacitor active area region 320. PMOS FETs used as transistor devices are formed in PMOS device active area region 310 and reduced magnitude Vt or depletion mode PMOS capacitors are formed in PMOS capacitor active area region 320.

FIG. 6 illustrates some of the process steps used in one embodiment of forming a reduced magnitude Vt or depletion mode PMOS capacitor using the NMOS FET Vt adjustment dopant implant. A first masking layer 330 is formed over PMOS device active area region 310, but is not formed over PMOS capacitor active area region 320. Thus, PMOS capacitor active area region 320 is left unprotected from dopant implantation during the subsequent NMOS FET Vt adjustment.

An NMOS FET Vt adjustment step comprises ion-implanting p-type dopants into the NMOS device active area regions 260 and the PMOS capacitor active area regions 320. In the NMOS device active area regions 260, the NMOS FET Vt adjustment step increases the magnitude of Vt of NMOS FET devices. This makes Vt a more positive voltage for NMOS FET devices. In one embodiment, the PMOS capacitor active area regions 320 receive p-type dopants from this same NMOS FET Vt adjustment step, although a separate ion-implantation step could also be used. This decreases the magnitude of Vt for a PMOS capacitor formed in the PMOS capacitor active area region 320, making Vt a more positive voltage for the PMOS capacitor. In one embodiment, the resulting Vt of the PMOS capacitor approximately equals or exceeds 0 volts, thereby forming a depletion mode capacitor in which an inversion layer forms in the channel region even when 0 volts is applied to the gate terminal of the depletion mode PMOS capacitor.

The reduced magnitude Vt or depletion mode PMOS capacitor increases the useful voltage range over which the capacitor is useful. Thus, the NMOS Vt adjustment implantation step is advantageously used to implement a reduced Vt or depletion mode PMOS capacitor, although as explained above, a separate implantation step may also be used.

In one embodiment, the NMOS Vt adjustment step comprises a shallow ion-implantation of a dose of approximately 1.75 E12 p-type dopants, such as boron, at an implant energy of approximately 25 KeV. This reduces the magnitude of Vt of the PMOS capacitor from approximately −0.8 volts to −0.3 volts, thereby increasing the useful voltage range of the PMOS capacitor.

Figure 7:
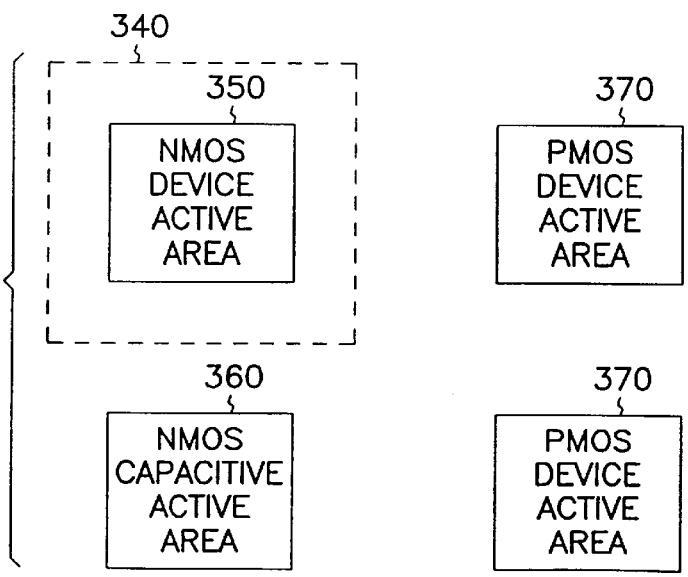
FIG. 7 is a schematic top view of a silicon wafer illustrating active area regions and masking regions including an active area region for forming a reduced magnitude Vt n-channel MOS FET used as a MOS capacitor.

FIG. 7 illustrates one embodiment of forming a reduced magnitude Vt or depletion mode NMOS capacitor using an optional PMOS FET Vt adjustment dopant implant available on some CMOS processes. A first masking layer 340 is formed over NMOS device active area region 350, but is not formed over NMOS capacitor active area region 360. Thus, NMOS capacitor active area region 360 is left unprotected from dopant implantation during the subsequent PMOS FET Vt adjustment.

A PMOS FET Vt adjustment step comprises ion-implanting n-type dopants into the PMOS device active area regions 370 and the NMOS capacitor active area regions 360. In the PMOS device active area regions 370, the Vt adjustment step increases the magnitude of Vt. This makes Vt a more negative voltage for the PMOS FET devices. In one embodiment, the NMOS capacitor active area regions 360 receive n-type dopants from this same PMOS FET Vt adjustment step, although a separate ion-implantation step could also be used. This decreases the magnitude of Vt for an NMOS capacitor formed in the NMOS capacitor active area region 360, making Vt a less positive voltage. In one embodiment, the resulting Vt of the NMOS capacitor is less than or equal to approximately 0 volts, thereby forming a depletion mode capacitor in which an inversion layer forms in the channel region when 0V is applied to the gate terminal of the depletion mode NMOS capacitor. The reduced magnitude Vt increases the NMOS capacitor's useful voltage range. Thus, the PMOS FET Vt adjustment implantation step is advantageously used to implement a reduced Vt or depletion mode NMOS capacitor.

In one embodiment, the PMOS FET Vt adjustment step comprises a shallow ion-implantation of a dose of approximately 1.5 E12 n-type dopants, such as phosphorus, at an implant energy of approximately 25 KeV. This reduces the magnitude of Vt of the NMOS capacitor from approximately 0.8 volts to 0.3 volts, thereby increasing the voltage range over which the NMOS capacitor is useful.

Figure 1:
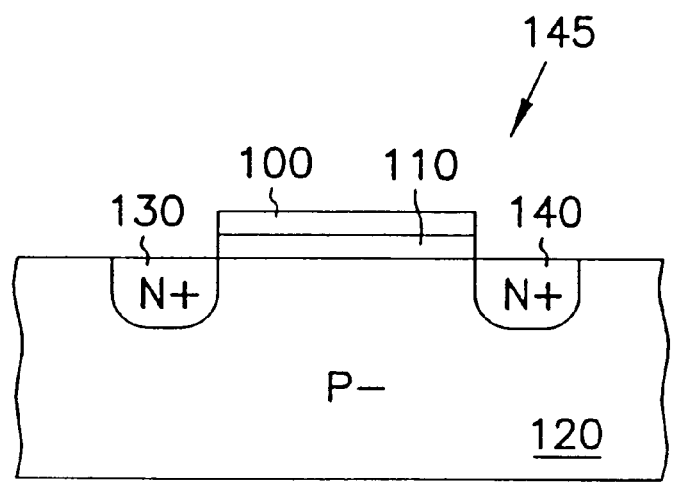
FIG. 1 is a schematic cross-sectional view illustrating a n-channel metal-oxide-semiconductor (MOS) field-effect transistor (FET).
Figure 2:
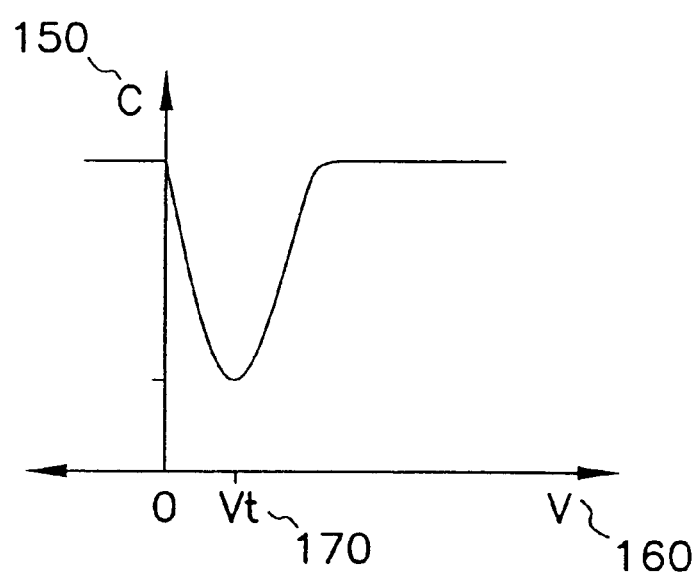
FIG. 2 is a graph illustrating capacitance vs. applied gate voltage for a n-channel MOS FET.
Figure 3:
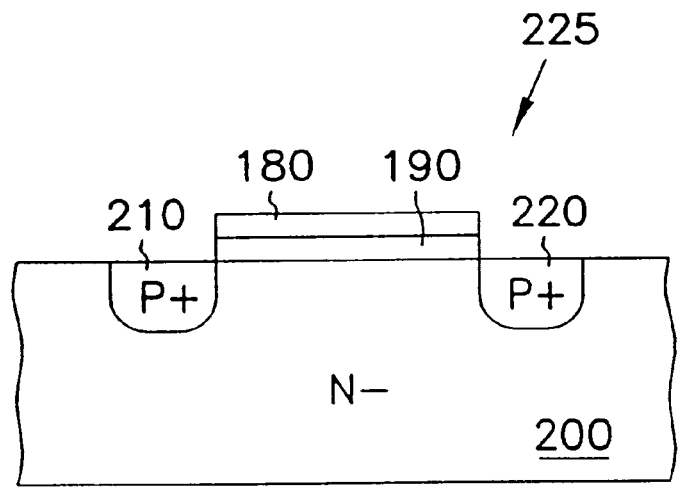
FIG. 3 is a schematic cross-sectional view illustrating a p-channel MOS FET.
Figure 4:
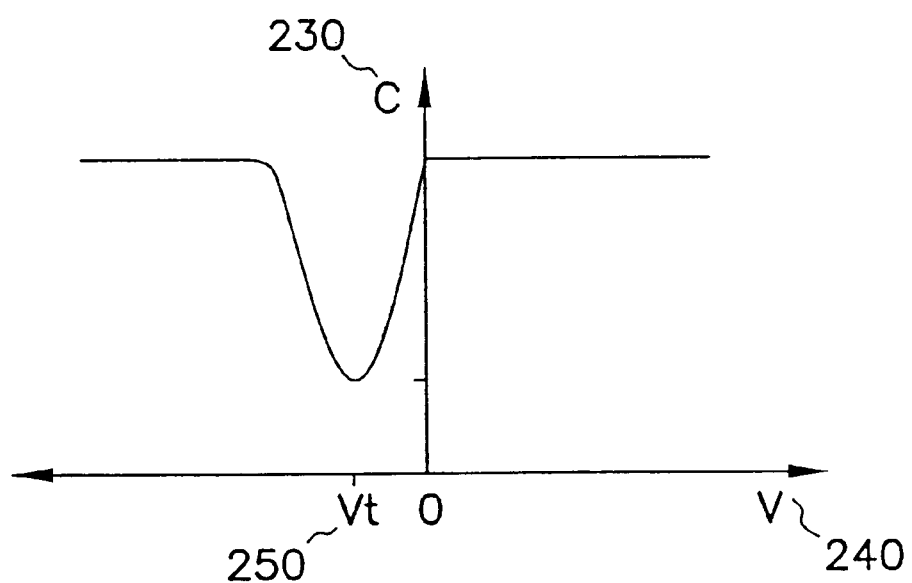
FIG. 4 is a graph illustrating capacitance vs. applied gate voltage for a p-channel MOS FET.

Many applications require that bottom plate terminal of the capacitor not be dedicated to the ground voltage potential, its voltage instead is allowed to vary as dictated by circuit operation. In FIG. 3, the source region 210 and the drain region 220 are each capable of being used to contact the bottom plate terminal of the capacitor. The bottom plate terminal of the capacitor is formed by an inversion region in substrate 200 underneath the dielectric 190 when the applied gate voltage is more negative than the Vt of the capacitor.

A reduced magnitude Vt or depletion mode capacitor is capable of providing a particular advantage in a charge pump circuit such as a substrate bias voltage generator in a dynamic random access memory (DRAM) integrated circuit. DRAM memory integrated circuits often use a substrate bias voltage generator to decrease parasitic reverse-bias pn junction capacitance between a buried contact node in a DRAM cell storage capacitor and the substrate. For example, in a DRAM cell array fabricated on an integrated circuit using p-type starting material, a substrate bias voltage generator comprising a charge pump is used to pump the substrate to a negative voltage of approximately −1V. A reduced magnitude Vt or depletion mode MOS capacitor is particularly useful in such a capacitive charge pump circuit, since it requires less power supply voltage to operate in its useful capacitance range.

Figure 8:
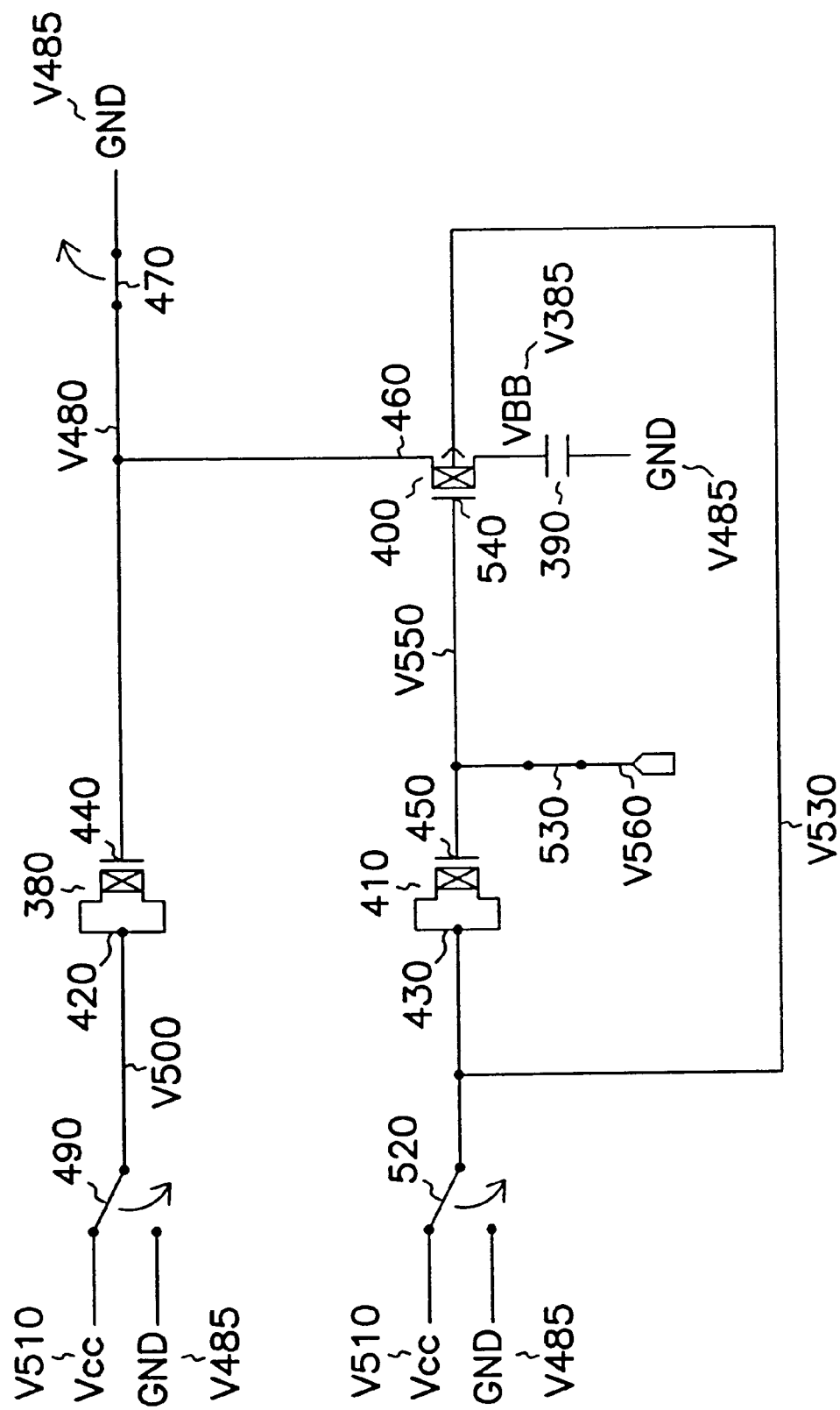
FIG. 8 illustrates a charge pump circuit capable of generating a substrate bias voltage in a dynamic random access memory (DRAM) in which reduced Vt capacitors are used.

FIG. 8 illustrates a switched capacitor charge pump circuit capable of being used as a substrate bias voltage generator. In the charge pump circuit of FIG. 8, reduced magnitude Vt or depletion mode MOS capacitors are advantageously used. The charge pump circuit operates by switching between two states. In a first "fill" state, charge is stored on transfer capacitor 380. In a second "dump" state, charge on transfer capacitor 380 redistributes through PMOS switch 400 onto substrate VBB at node V385 Substrate VBB at node V385 has a capacitance 390 to ground node V485.

In one embodiment, transfer capacitor 380 and drive capacitor 410 are reduced magnitude Vt or depletion mode PMOS capacitors having a first transfer capacitor terminal 420 and a first drive capacitor terminal 430 respectively, each comprising a PMOS source diffusion or a PMOS drain diffusion or both a PMOS source and drain diffusion. Transfer capacitor 380 and drive capacitor 410 also have a second transfer capacitor terminal 440 and a second drive capacitor terminal 450 respectively, each comprising a PMOS gate terminal.

In FIG. 8, second transfer capacitor terminal 440 is coupled to first switch terminal 460 of PMOS switch 400 and to switch 470 at node V480. Switch 470 is closed during the fill state, thereby coupling node V480 to ground node V485 at 0V during the fill state. During the dump state, switch 470 presents a high impedance to node V480. First transfer capacitor terminal 420 is coupled to switch 490 at node V500. Switch 490 couples node V500 to a positive supply voltage VCC node V510 during the fill state, and couples node V500 to ground node V485 during the dump state. In one embodiment, the positive supply voltage VCC at node V510 is at approximately +3 volts.

In FIG. 8, first drive capacitor terminal 430 is coupled to a body terminal of PMOS switch 400 and to switch 520 at node V530. Switch 520 couples node V530 to VCC node V510 during the fill state, and to ground node V485 during the dump state. Second drive capacitor terminal 450 is coupled to switch 530 and to control terminal 540 of PMOS switch 400 at node V550. Switch 530 couples node V550 to node V560 during the fill state, and presents a high impedance between nodes V550 and V560 during the dump state. Node V560 is supplied with an intermediate voltage between 0V and the substrate voltage VBB. The intermediate voltage at node V560 is derived from the substrate voltage VBB. In one embodiment, a switched capacitor divider network can be used to generate the intermediate voltage supplied to node V560.

In FIG. 8, generic switches represent switches 470, 490, 520, and 530. It is recognized by one skilled in the art that these switches could be implemented by PMOS or NMOS FETs, or any other suitable switching device, or by multiple switching devices, without departing from the scope and spirit of the invention. It is also recognized that reduced magnitude Vt or depletion mode NMOS capacitors may be used to implement charge transfer capacitor 380 and drive capacitor 410.

In FIG. 8, the charge pump circuit operates to cyclically pump substrate voltage VBB at node V385 to a negative voltage between 0V and −VCC, where VCC is the positive supply voltage at node V510. A regulator circuit can be used to continuously cycle the charge pump between fill and dump states, and to interrupt this cycling when VBB attains the desired voltage.

The cycling operation is described as follows. In the fill state, PMOS switch 400 is off. For a +3V positive supply voltage VCC at node V510, first transfer capacitor terminal 420 at node V500 is at approximately 3V, and second transfer capacitor terminal 440 at node V480 is at approximately 0V in the fill state. In this fill state, first drive capacitor terminal 430 at node V530 is at approximately 3V, and the second drive capacitor terminal 450 at node V550 is approximately at the intermediate voltage of node V560 between 0V and VBB, where VBB is the negative substrate voltage generated by the charge pump circuit of FIG. 8.

In the dump state, first transfer capacitor terminal 420 at node V500 is coupled to ground voltage node V485 at approximately 0V, thereby forcing the second transfer capacitor terminal 440 at node V480 to −3V. In the dump state, first drive capacitor terminal 430 at node V530 is also coupled to ground voltage node V485 at approximately 0V, thereby forcing the second drive capacitor terminal 450 at node V550 more negative than −3V. This turns on PMOS switch 400, thereby redistributing charge from charge transfer capacitor 380 through PMOS switch 400 onto substrate capacitance 390. This redistribution of charge pumps VBB at node V385 to a more negative voltage. By continuously cycling the charge pump circuit of FIG. 8, the substrate voltage VBB at node V385 asymptotically approaches a voltage −VCC. A regulator circuit may be used to interrupt the cyclic charging of the substrate voltage VBB at node V385 before the asymptotic value of −VCC is reached.

The advantages of using a reduced magnitude Vt or depletion mode MOS capacitor for the transfer capacitor 380 and the drive capacitor 410 are apparent. The maximum charge available for transfer during a dump state is equal to a product of the capacitance and the voltage across it exceeding the magnitude of Vt. By decreasing the magnitude of Vt, the maximum charge available for transfer during a dump state is increased. As a result, both the throughput and the efficiency of the charge pump circuit are increased.

Thus, the present invention discloses a metal-oxide-semiconductor (MOS) capacitor having an increased voltage range, a method for its fabrication, and charge pump substrate voltage generator circuit for a dynamic random access memory (DRAM) integrated circuit in which it is used. The increased voltage range is implemented by decreasing the magnitude of a threshold voltage (Vt) of the MOS capacitor. In one embodiment, the Vt is reduced sufficiently to form a depletion mode device. The magnitude of Vt is reduced without adding steps to an existing conventional complementary metal-oxide-semiconductor (CMOS) process flow.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A method of converting an input voltage supply to an output voltage supply of a different magnitude or polarity, the method comprising:

charging a metal-oxide-semiconductor (MOS) capacitor having a threshold voltage magnitude of less than 0.3V, the capacitor having a first capacitor terminal and a second capacitor terminal, by applying a first voltage level to the first capacitor terminal and applying a second voltage level to the second capacitor terminal;

removing the first voltage level applied to the first capacitor terminal and applying a third voltage level to the first capacitor terminal;

removing the second voltage level applied to the second capacitor terminal; and coupling the second capacitor terminal to the output voltage supply through a switch while the third voltage level is applied to the first capacitor terminal.

2. A method of converting an input voltage supply to an output voltage supply of a different magnitude or polarity, the method comprising:

charging a depletion mode metal-oxide-semiconductor (MOS) capacitor having a first capacitor terminal and a second capacitor terminal by applying a first voltage level to the first capacitor terminal and applying a second voltage level to the second capacitor terminal;

removing the first voltage level applied to the first capacitor terminal and applying a third voltage level to the first capacitor terminal;

removing the second voltage level applied to the second capacitor terminal; and coupling the second capacitor terminal to the output voltage supply through a switch while the third voltage level is applied to the first capacitor terminal.

3. The method of claim 2, wherein the output voltage supply approaches a potential having substantially the same magnitude as a magnitude of the input voltage supply, and the output voltage supply has a polarity opposite a polarity of the input voltage supply.

4. The method of claim 2, wherein the output voltage supply approaches a potential having a different magnitude than a magnitude of the input voltage supply, and the output voltage supply has a polarity the same as a polarity of the input voltage supply.

5. A circuit for converting an input voltage supply to an output voltage supply of a different magnitude or polarity, the circuit comprising:

a metal-oxide-semiconductor (MOS) transfer capacitor having a threshold voltage magnitude of less than 0.3V, and having a first transfer capacitor terminal and a second transfer capacitor terminal;

a first switch coupled to the first transfer capacitor terminal and adapted to switchably couple the first transfer capacitor terminal to one of a first voltage node and a second voltage a second switch coupled to the second transfer capacitor terminal and adapted to switchably couple the second transfer capacitor terminal to a third voltage node; and a third switch having first and second switch terminals and a control terminal, the first switch terminal coupled to the second transfer capacitor terminal, the second switch terminal coupled to the output voltage supply, and the control terminal having an applied voltage controlling conduction between the first and second switch terminals.

6. The circuit of claim 5, further comprising:

a MOS drive capacitor having a threshold voltage magnitude of less than 0.3V, and having a first drive capacitor terminal and a second drive capacitor terminal, wherein the second drive capacitor terminal is coupled to the control terminal of the third switch.

7. A circuit for converting an input voltage supply to an output voltage supply of a different magnitude or polarity, the circuit comprising:

a depletion mode metal-oxide-semiconductor (MOS) transfer capacitor having a first transfer capacitor terminal and a second transfer capacitor terminal;

a first switch coupled to the first transfer capacitor terminal and adapted to switchably couple the first transfer capacitor terminal to one of a first voltage node and a second voltage node;

a second switch coupled to the second transfer capacitor terminal and adapted to switchably couple the second transfer capacitor terminal to a third voltage node; and a third switch having first and second switch terminals and a control terminal, the first switch terminal coupled the second transfer capacitor terminal, the second switch terminal coupled to the output voltage supply, and the control terminal having an applied voltage controlling conduction between the first and second switch terminals.

8. A dynamic random access memory (DRAM) integrated circuit comprising:

a charge pump circuit for converting an input voltage supply to an output voltage supply of a different magnitude or polarity, the charge pump circuit comprising:

a metal-oxide-semiconductor (MOS) capacitor having a threshold voltage magnitude of less than 0.3V, and having a first capacitor terminal and a second capacitor terminal;

a first switch coupled to the first transfer capacitor terminal and adapted to switchably couple the first transfer capacitor terminal to one of a first voltage node and a second voltage node;

a second switch coupled to the second transfer capacitor terminal and adapted to switchably couple the second transfer capacitor terminal to a third voltage node; and a third switch having first and second switch terminals and a control terminal, the first switch terminal coupled the second capacitor terminal, the second switch terminal coupled to the output voltage supply, and the control terminal having an applied voltage controlling conduction between the first and second switch terminals.

9. The DRAM integrated circuit of claim 8, wherein the charge pump circuit converts an input voltage supply to an output voltage supply which is applied to the substrate.

10. A method of converting an input voltage supply to an output voltage supply of a different magnitude or polarity, the method comprising:

charging a depletion mode metal-oxide-semiconductor (MOS) capacitor having a first capacitor terminal and a second capacitor terminal by applying a first voltage level to the first capacitor terminal and applying a second voltage level to the second capacitor terminal;

removing the first voltage level applied to the first capacitor terminal and applying a third voltage level to the first capacitor terminal, wherein the third voltage level and the second voltage level are at substantially the same potential;

removing the second voltage level applied to the second capacitor terminal; and coupling the second capacitor terminal to the output voltage supply through a switch while the third voltage level is applied to the first capacitor terminal.

11. The method of claim 10, wherein the first voltage level is a positive supply voltage and the second and third voltage levels are both ground potentials.

12. A method of converting an input voltage supply to an output voltage supply of a different magnitude or polarity, the method comprising:

charging a depletion mode metal-oxide-semiconductor (MOS) capacitor having a first capacitor terminal and a second capacitor terminal by applying a first voltage level to the first capacitor terminal and applying a second voltage level to the second capacitor terminal;

removing the first voltage level applied to the first capacitor terminal by presenting a high impedance between a source node of the second voltage level and the second capacitor terminal, and applying a third voltage level to the first capacitor terminal, wherein the third voltage level and the second voltage level are at substantially the same potential;

removing the second voltage level applied to the second capacitor terminal; and coupling the second capacitor terminal to the output voltage supply through a switch while the third voltage level is applied to the first capacitor terminal.

13. A method of converting an input voltage supply to an output voltage supply of a different magnitude or polarity, the method comprising:

charging a depletion mode metal-oxide-semiconductor (MOS) capacitor having a first capacitor terminal and a second capacitor terminal by applying a first voltage level to the first capacitor terminal and applying a second voltage level to the second capacitor terminal, wherein the first voltage level is a positive voltage and the second voltage level is a ground potential;

removing the first voltage level applied to the first capacitor terminal and applying a third voltage level to the first capacitor terminal, wherein the third voltage level is a ground potential;

removing the second voltage level applied to the second capacitor terminal; and coupling the second capacitor terminal to the output voltage supply through a switch while the third voltage level is applied to the first capacitor terminal.

14. A circuit for converting an input voltage supply to an output voltage supply of an opposite polarity, the circuit comprising:

a depletion mode metal-oxide-semiconductor (MOS) transfer capacitor having a first transfer capacitor terminal and a second transfer capacitor terminal;

a first switch coupled to the first transfer capacitor terminal and adapted to switchably couple the first transfer capacitor terminal to one of a first voltage node and a second voltage node, wherein the first voltage node is adapted to supply the input voltage supply and the second voltage node is adapted to supply a ground potential;

a second switch coupled to the second transfer capacitor terminal and adapted to switchably couple the second transfer capacitor terminal to a third voltage node, wherein the third voltage node is adapted to supply a ground potential; and a third switch having first and second switch terminals and a control terminal, the first switch terminal coupled the second transfer capacitor terminal, the second switch terminal coupled to the output voltage supply, and the control terminal having an applied voltage controlling conduction between the first and second switch terminals.

15. The circuit of claim 14, wherein the input voltage supply has a positive polarity and the output voltage supply has a negative polarity.

* * * * *